United States Patent
Kuo et al.

(10) Patent No.: US 9,929,141 B2
(45) Date of Patent: Mar. 27, 2018

(54) DEVICES WITH AN EMBEDDED ZENER DIODE

(71) Applicant: Allegro Microsystems, LLC, Worcester, MA (US)

(72) Inventors: Chung C. Kuo, West Boylston, MA (US); Maxim Klebanov, Newton, MA (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 15/089,787

(22) Filed: Apr. 4, 2016

(65) Prior Publication Data

US 2017/0287894 A1 Oct. 5, 2017

(51) Int. Cl.
| | |
|---|---|
| H01L 27/02 | (2006.01) |
| H01L 29/10 | (2006.01) |
| H01L 29/739 | (2006.01) |
| H01L 29/74 | (2006.01) |
| H01L 29/78 | (2006.01) |
| H01L 29/866 | (2006.01) |
| H01L 29/87 | (2006.01) |

(52) U.S. Cl.
CPC ...... *H01L 27/0259* (2013.01); *H01L 27/0255* (2013.01); *H01L 27/0262* (2013.01); *H01L 27/0266* (2013.01); *H01L 29/1095* (2013.01); *H01L 29/7393* (2013.01); *H01L 29/7412* (2013.01); *H01L 29/7821* (2013.01); *H01L 29/866* (2013.01); *H01L 29/87* (2013.01); *H01L 29/7436* (2013.01)

(58) Field of Classification Search
None
See application file for complete search history.

(56) References Cited

U.S. PATENT DOCUMENTS

| | | | |
|---|---|---|---|
| 5,465,189 A | 11/1995 | Polgreen et al. | |
| 5,856,214 A | 1/1999 | Yu | |
| 6,081,002 A | 6/2000 | Amerasekera et al. | |
| 6,268,639 B1 | 7/2001 | Li et al. | |
| 8,922,962 B2 | 12/2014 | Lamar et al. | |
| 9,318,481 B1 | 4/2016 | Wang et al. | |
| 2007/0090392 A1 | 4/2007 | Boselli | |
| 2009/0278168 A1* | 11/2009 | Hwang | H01L 27/0262 257/173 |
| 2009/0315113 A1 | 12/2009 | Vashchenko | |

(Continued)

FOREIGN PATENT DOCUMENTS

| | | |
|---|---|---|
| DE | 10314604 A1 | 11/2004 |
| WO | WO 2015/056040 A1 | 4/2015 |

OTHER PUBLICATIONS

U.S. Appl. No. 14/847,519, filed Sep. 8, 2015, Wang et al.

(Continued)

*Primary Examiner* — Matthew Reames
(74) *Attorney, Agent, or Firm* — Daly, Crowley, Mofford & Durkee, LLP

(57) ABSTRACT

In one aspect, a silicon-controlled rectifier (SCR) includes a Zener diode embedded in the SCR. In another aspect, a laterally diffused metal oxide semiconductor (LDMOS) includes a Zener diode embedded in the LDMOS. In a further aspect, a lateral insulated-gate bipolar transistor (IGBT) includes a Zener diode embedded in the IGBT.

30 Claims, 6 Drawing Sheets

(56) References Cited

U.S. PATENT DOCUMENTS

2015/0236011 A1    8/2015  Wang et al.

OTHER PUBLICATIONS

Office Action dated Sep. 2, 2015 for U.S. Appl. No. 14/621,766; 7 Pages.
Response to Office Action dated Sep. 2, 2015 for U.S. Appl. No. 14/621,766; Response filed Dec. 29, 2015; 9 Pages.
Notice of Allowance dated Feb. 16, 2016 for U.S. Appl. No. 14/847,519; 9 Pages.
$2^{nd}$ Notice of Allowance dated Mar. 9, 2016 for U.S. Appl. No. 14/847,519; 6 Pages.
Notice of Allowance dated Apr. 28, 2016 corresponding to U.S. Appl. No. 14/621,766; 11 Pages.
PCT International Search report and Written Opinion dated Jun. 2, 2017 for International Application No. PCT/US2017/023718; 17 Pages.

\* cited by examiner

US 9,929,141 B2

DEVICES WITH AN EMBEDDED ZENER DIODE

BACKGROUND

A silicon-controlled rectifier (SCR) (sometimes referred to as a thyristor) includes four semiconductor regions (e.g., NPNP or PNPN) and three junctions. Generally, the SCR includes three terminals (a cathode, an anode and a gate). The SCR may be configured to switch large levels of power. The SCR may be used in a variety of applications such as, for example, lamp dimmers, AC power switching circuits, over-voltage protection, electrostatic discharge (ESD) protection of integrated circuits and so forth.

SUMMARY

In one aspect, a silicon-controlled rectifier (SCR) includes a Zener diode embedded in the SCR. In another aspect, a laterally diffused metal oxide semiconductor (LDMOS) includes a Zener diode embedded in the LDMOS. In a further aspect, a lateral insulated-gate bipolar transistor (IGBT) includes a Zener diode embedded in the IGBT.

One or more of the aspects above may include but are not limited to one or more of the following advantages. The SCR has a trigger voltage for events (e.g., electrostatic discharge (ESD) events) that is flexible and controllable. The SCR has a holding voltage during these events that may be kept relatively high, flexible and controllable compared to traditional SCRs. The SCR provides little (or no) snapback. The SCR has lower (or no) susceptibility to the latch-up mode. The SCR has less chance of secondary breakdown and can sustain a higher avalanche current during an event (e.g., ESD event). In other examples, the Zener diode may also be "inserted" or "embedded" into existing laterally diffused metal-oxide-semiconductor (LDMOS) and lateral insulated-gate bipolar transistor (IGBT) layout to enhance their ESD immunity, for example (sometimes called "self-protected" devices).

DETAIL DESCRIPTION

Described herein are techniques to form a device with an embedded Zener diode. In one example, as will be described further herein, a silicon-controlled rectifier (SCR) device structure with a Zener diode provides, for example, an adjustable trigger voltage, an adjustable higher holding voltage, and achieves a "non-snapback" ESD response compared to traditional SCRs without a Zener diode. In one example, the Zener diode may provide a voltage-sensitive trigger and an extra current path as another feature to control the performance of the ESD protection. In another example, these techniques may be applied to form a LDMOS or lateral IGBT with an embedded Zener diode for enhancing ESD immunity.

In semiconductor device level, the electrostatic discharge (ESD) event may exert a voltage much higher than the maximum voltage rating of the device, and consequently may induce an electrical breakdown via avalanche of carriers, a chain reaction of generating a lot of holes and electrons, or may further induce latch-up. The magnitude, duration and repetition of such event may create permanent physical damages and a failure of the device. SCRs may be used in integrated circuits to protect the integrated circuits from ESD events.

As used herein, "snapback" means that after being triggered on by an avalanche breakdown due to an overvoltage event, the SCR exhibits a holding voltage that is smaller than the trigger voltage. "Non-snapback," as described herein, means that the holding voltage is equal or larger than the trigger voltage.

As used herein, the term "trigger voltage", $V_{t1}$, is the voltage that the SCR starts to conduct current using the parasitic bipolar action when an overvoltage is applied between the anode and cathode without the controlling gate being turned on.

As used herein, the term "holding voltage", $V_h$, is the voltage needed to sustain the current conduction in the SCR after the SCR is triggered on by an overvoltage event.

ESD induced failure is a major concern for the integrated circuits (ICs) in advanced and main-stream technologies. This reliability issue is worsened in a high-voltage circumstance because of the rising risk of latch-up in parasitic bipolar transistors. As will be further described herein, in one example, a Zener diode is embedded in the center of a traditional SCR serving as the voltage trigger element, which alters the SCR behavior under ESD and may enhance SCR's robustness to ESD by forming a current path from the anode 62 to a resistor, R, to the N+-type region 44 to the p-type region 42.

Figure 1:
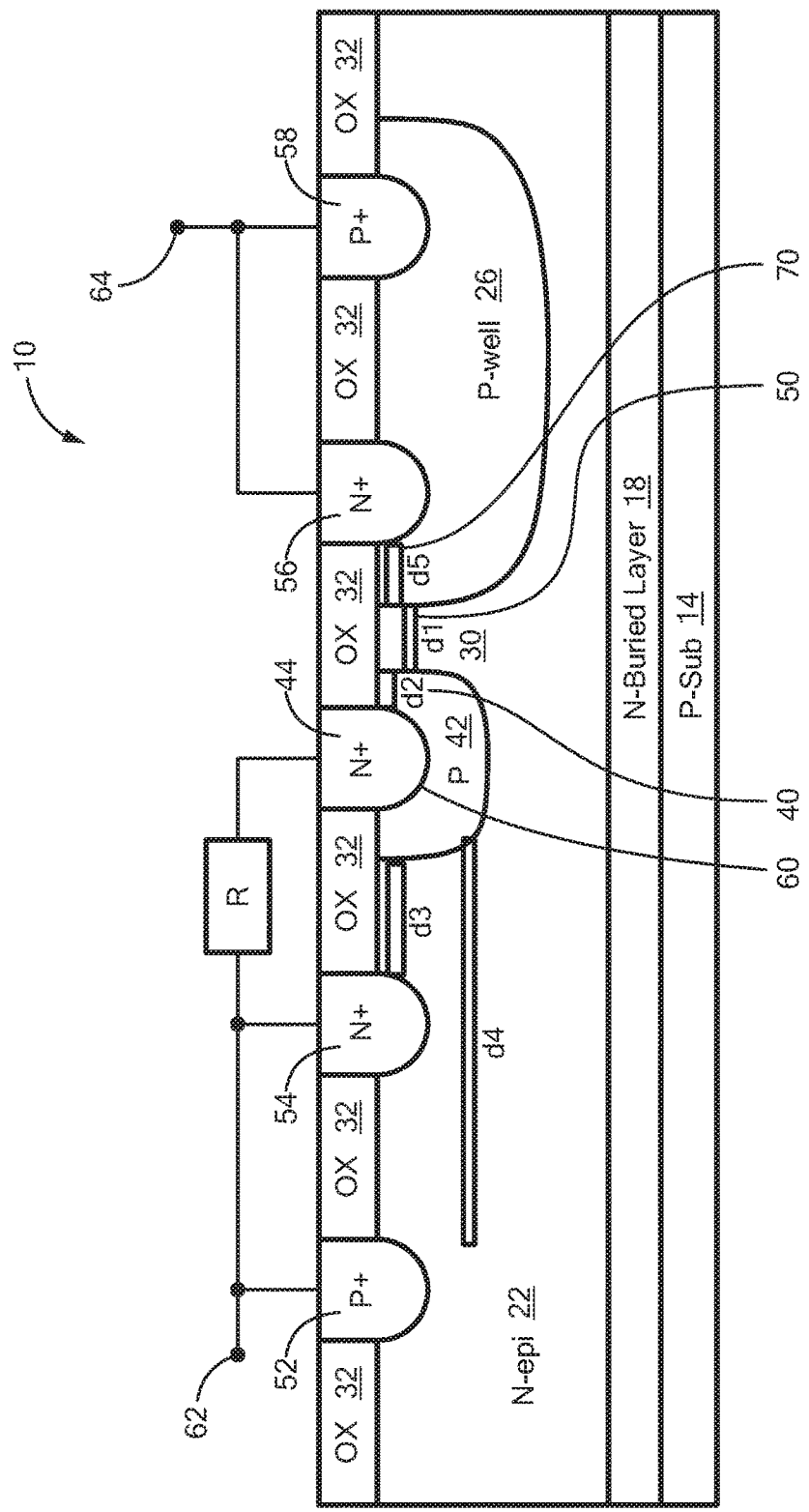
FIG. 1 is a block diagram of an example of silicon-controlled rectifier (SCR) with an embedded Zener diode.

Referring to FIG. 1, a silicon-controlled rectifier (SCR) 10 includes a p-region 42 and an N+ region 44, which form a Zener diode. The SCR 10 also includes a p-type well 26 and an n-type epitaxial layer 22 on an n-type buried layer 18, which is on a p-type substrate 14. The SCR 10 further includes an anode 62 connected to a P+-type region 52, an N+-type region 54 and the N+-type region 44; and a cathode 64 connected to an N+-type region 56 and a P+-type region 58, which is a gate. In one example, the Zener diode 42, 44 may occupy from 10% to 100% area ratio in the third dimension (i.e., the width dimension of the SCR 10). In other examples, the SCR 10 may be fabricated with an n-type well instead of the n-type epitaxial layer. In other examples, the SCR 10 may be fabricated on a p-type layer, which is on n-type substrate.

A region 30 of the n-type epitaxial layer 22 is between the p-type region 42 and the p-type well 26 and is measured by a distance, d1. A region 40 of the p-type region 42 is a distance, d2, between the N+ 44 and the region 30 of the n-type epitaxial layer 22. In one example, increasing d1 and/or d2 increases the trigger voltage of SCR 10.

The p-type well 26 and the n-type epitaxial layer 22 form a junction 50. The N+-type region 56 and the p-type well 26 from a junction 70.

A distance, d3, is the distance from the N+-type region 54 and the p-type region 42. A distance, d4, is a distance from the P+-type region 52 to the p-type region 42. In one example, increasing d3 and/or d4 increases the holding voltage of SCR 10.

A distance, d5, is the distance between the junction 50 and the junction 70. In one example, increasing d5 increases the holding voltage of SCR 10.

In one example, the resistor, R, may connect the N+-type region 54 and the N+-type region 44 to the anode 62 and forms an alternative parallel current path (i.e., from the anode to the resistor, R to the N+-type region 44 to the p-type region 42) to an SCR path (i.e., from the anode 62 to the p-type well 26 via the "d4" region). In one particular example, R is zero Ohms.

The SCR 10 also includes oxide isolation regions 32 to isolate the N+-type and P+-type regions from one another. In one example, the oxide isolation regions 32 are a field oxide (FOX). In another example, oxide isolation regions 32 are a shallow trench isolation (STI). In a further example, the oxide isolation regions 32 are local oxidation of silicon (LOCOS).

In one example, the trigger voltage of the SCR 10 may be flexibly adjusted. The Zener diode 42, 44 is the key element of the trigger voltage in addition to the reversed p-type well 26/n-type epitaxial layer 22 junction (called herein junction 50). When a positive voltage pulse, $V_a$, is applied across the anode 62 and the cathode 64, a breakdown starts (e.g., the avalanche current is in the 100 µA range) when the voltage, $V_a$, is equal to the sum of the Zener voltage, $V_Z$, and the voltage, $V_{d1}$, required to deplete the region 30 of the n-epitaxial layer 22. The trigger voltage, $V_{t1}$, is the voltage difference between the Zener diode 42, 44 and the cathode 64, which is the sum of the breakdown voltage and the extra voltage, $V_{AV}(I_{t1})$, of the Zener diode and/or the junction 50 required to sustain the level of the triggering avalanche current ($I_{t1}$). This avalanche current, $I_{t1}$, is a device-dependent parameter and defined by the trigger voltage $V_{t1}$ where the voltage across the device may snapback due to a change of its conduction mode. Thus, the trigger voltage can be adjusted by the Zener voltage $V_Z$ and the length d1. In one example, a trigger voltage is expressed as $V_{t1}=V_Z+V_{d1}+V_{AV}(I_{t1})$.

In one example, the SCR 10 has a lower chance of a damaging secondary breakdown. The Zener diode, 42, 44 provides holes for the conduction current during the breakdown and has unique advantages. Because the Zener diode 42, 44 is a one-sided N+/P diode and the p-type region 42 is narrow and has a moderately higher doping concentration (e.g., 1e17/cm3) than the p-type well 26 in the cathode 64, the Zener diode 42, 44 has a faster rate of increasing the breakdown current than that of the junction 50. When the distance, d1, is sufficiently short in length (e.g., 1.0 µm), the holes from a Zener diode junction 60 will be injected into the region 30 of the n-type epitaxial layer 22 as the dominant conducting carriers excluding the electron-hole pairs generated by impact ionizations. Meanwhile, the electrons from the Zener diode 42, 44 will drift into the shallow N+ region 44 and be rapidly recombined at the contact. Because the hole carrier has a smaller impact ionization coefficient (about one half of electron's), its multiplication coefficient is smaller, thus, a drastically uncontrollable avalanche is less likely to occur. This provides a more robust operation and a possibility for a higher reversible maximum current $I_{t2}$.

The embedded Zener diode 42, 44 is not equivalent to an external Zener diode. For example, if an external Zener diode is connected to the same site where the embedded Zener diode is located, the device behavior will not be the same. This has to be analyzed in two cases. For the first case, an external Zener diode is connected to the n-type epitaxial layer 22 via another N+-type contact. This N+-type contact drains electrons but cannot inject holes. Secondly, if a P-type contact is used, it can inject holes at a higher efficiency as long as the potential is allowed and the voltage will snapback like a traditional SCR. However, because the region 40 of the p-type region 42 of the embedded Zener diode 42, 44 is very narrow that it is fully depleted when the Zener diode is in the breakdown condition. The region 40 of the p-type region 42 cannot inject holes except those from the avalanche and multiplication. Therefore, the embedded parallel Zener diode 42, 44 cannot be replaced by an external one, and the holding voltage will be high because the region 30 of n-epitaxial layer 22 remains to be depleted.

In one example, the SCR 10 has a holding voltage that remains high and can be flexibly adjusted. A high holding voltage of an ESD device is desired for an ESD clamp or a power IC. However, when a strong conductivity modulation happens in a traditional SCR, the holding voltage rapidly drops to about 1.4 volt, for example, much lower than the required 10, 20, or 30 volt. In the SCR 10, the holding voltage can be described in two ways: one way is identical to the trigger voltage, the voltage difference between the Zener diode 42, 44 to the cathode 64. Another way is the difference between the anode 62 and the cathode 64 via n-epitaxial layer 22 of the SCR 10. When the avalanche current in the trigger surpasses the trigger current $I_{t1}$, the SCR 10 will be turned on partially or fully which depends on the voltage difference between the p-n junction 70 (i.e., the junction between N+-type region 56 and p-type well 26) of the cathode 64, the anode-cathode distance, and lateral geometric factors. If the SCR 10 is fully on, a strong conductivity modulation is induced and will pull down the voltage across the device and eventually disable the avalanche current from the Zener diode 42, 44. If the SCR 10 is only partially on and has a weak conductivity modulation, the SCR path (from anode 62 to p-type well 26 via the "d4" region) shares a small portion of the current. There is a middle point that the SCR 10 and the Zener diode 42, 44 share a proper ratio of the current to have a holding voltage close to the trigger voltage. The parameters including 1) the layout dimensions between the cathode's p-type well 26 (d1), the Zener diode, 42, 44 (d2), and the anode (d3, d4); 2) the anode injection efficiency related with the area ratio of P+-type region at anode; 3) the layout dimensions between these two junctions 50 and 70 (d5); 4) the forward bias of cathode p-n junction 70 by the layout area ratio to control the strength of conductivity modulation between the cathode and the anode; 5) the optional ballast resistor (e.g., R=0 to 10 kOhm) in series with the Zener diode 42, 44, can be used to adjust the holding voltage. This is the desired non-snapback case. Holding voltage is expressed as $V_h=V_Z+V_{d1}+V_{AV}(I) R^*I_Z$, where Iz is the current of Zener diode 42, 44.

In one example, the SCR 10 has little or no snapback. Since the holding voltage depends on the ratio of the current shared by two parallel paths: the SCR path (i.e., from anode 62 to p-type well 26 via the "d4" region) and the path from the anode to the Zener diode 42, 44. Because the SCR path could be controlled to be partially turned-on by the Zener diode 42, 44 and an optional ballast resistor (R) in series with the Zener diode 42, 44 and the layout dimensions, the holding voltage $V_h$ can be adjusted to be close to the trigger voltage $V_{t1}$ and the snapback is much reduced. In one particular application, the snapback is no greater than 10% of the trigger voltage, $V_{t1}$. In another particular example, the snapback is no greater than 10% of the trigger voltage Vt1 or no greater than the difference of the trigger voltage and the operating voltage at the node in the application-dependent circuit specifications, whichever is smaller.

In one example, the SCR 10 has lower or no susceptibility to the latch-up mode. The SCR 10 is triggered mainly by injecting avalanched holes from the Zener diode 42, 44 into the cathode 64 in an ESD event. Hole carriers have a less chance of generating hot carriers because holes have a smaller saturation velocity due to their heavier weight and lower mobility (about 33% of an electron). In addition, a portion of electrons from the cathode 64 can be diverted to the anode 42 of the Zener diode 42, 44 to reduce the avalanche multiplication effect. Because the cathode p-n junction 70 is not fully turned on, conductivity modulation is confined between the Zener diode 42, 44 and the anode 62 region (d4). This provides a feature to control the holding voltage and a lower probability of latch-up.

The Zener diode 42, 44 used in SCR 10 can be "inserted" or "embedded" into existing LDMOS and lateral IGBT layouts to enhance their ESD immunity as a trigger of self-protection and an alternative current path during ESD and overvoltage events. These devices are often called self-protected LDMOS or IGBT frequently used as the power output drivers in ICs. Similarly, the avalanched electrons from the junction 50 during an overvoltage event in LDMOS or lateral IGBT will be diverted into the Zener diode and will reduce the chance of latch-up, over current and irreversible damage. The layout area ratio and geometric locations of P+-type 52 and N+-type 54 region in the drain (for LDMOS) or collector (for IGBT) can be adjusted to meet the device ESD specifications.

Figure 2:
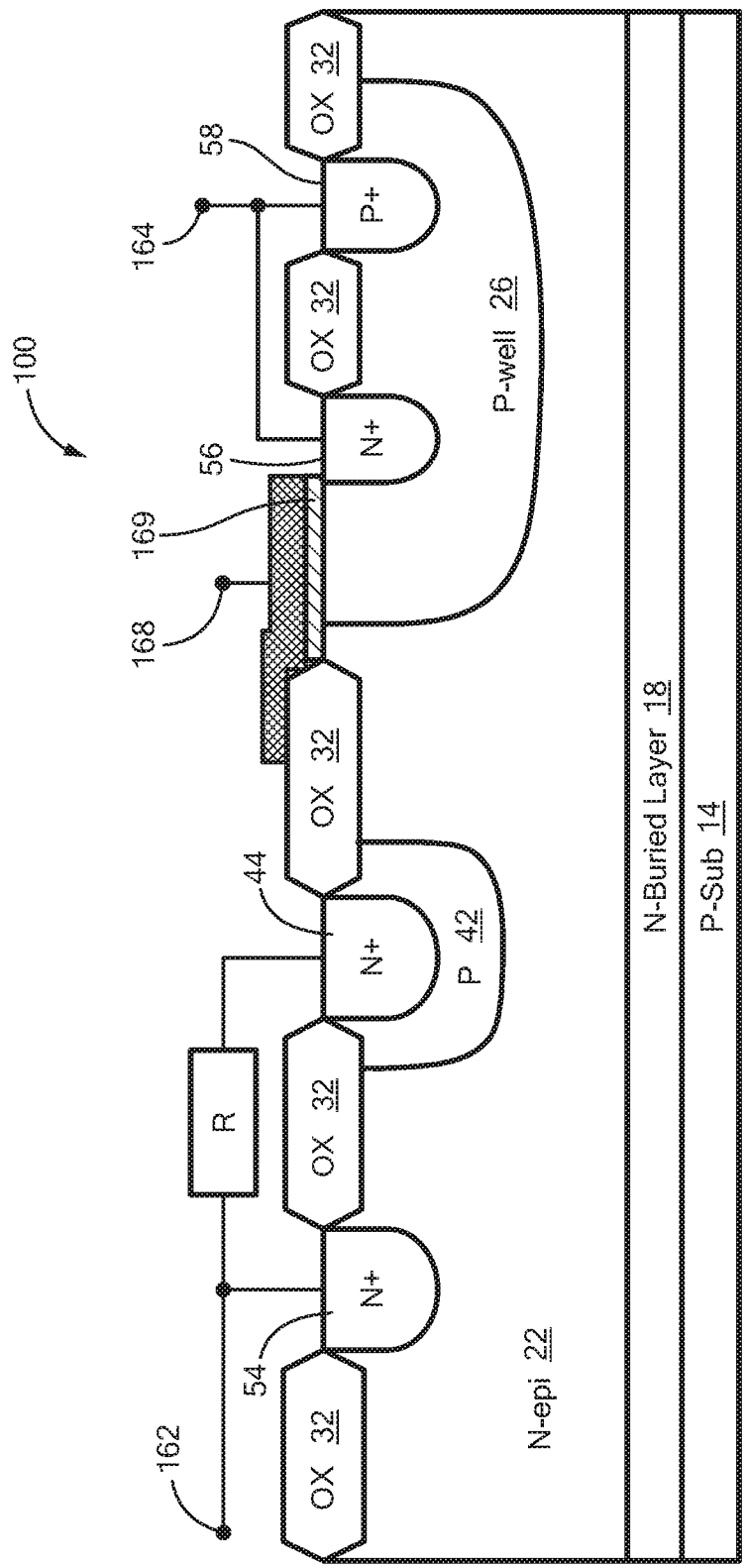
FIG. 2 is a block diagram of an example of a Zener diode embedded in a laterally diffused metal oxide semiconductor (LDMOS)

Referring to FIG. 2, for example, the Zener diode 42, 44 is embedded into an LDMOS to form an LDMOS 100. The LDMOS 100 is similar to the SCR 10 but does not include the P+ region 52. Also, the LDMOS 100 includes a drain 162 in place of an anode, a source 164 in place of the cathode and a gate 168 and gate dielectrics 169 of a metal oxide semiconductor (MOS) stack between an oxide insulation region 32 and the N+-type region 56 (i.e., there is no oxide insulation region 32 underneath the MOS gate 168). In one example, the gate dielectrics include gate oxide and silicon dioxide.

Figure 3:
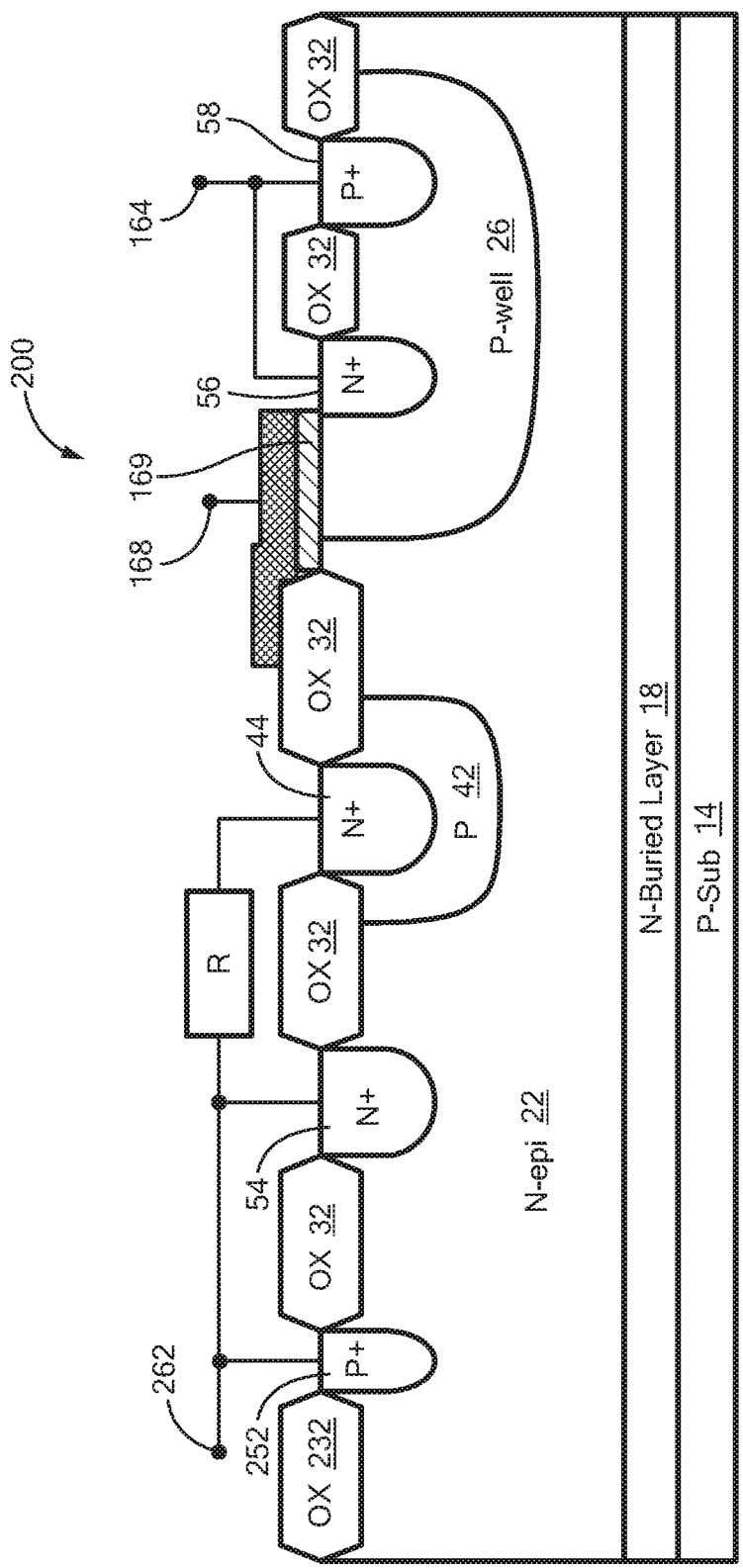
FIG. 3 is a block diagram of another example of the Zener diode embedded in a LDMOS.

Referring to FIG. 3, in another example, the Zener diode 42, 44 is embedded into an LDMOS to form an LDMOS 200. The LDMOS 200 is similar to the LDMOS 100, but includes an additional P+ region 252 and an additional oxide insulation region 232. Also, a drain 262 is connected to the P+ region 252 along with the N+-type region 54 and the N+-type region 44.

Figure 4:
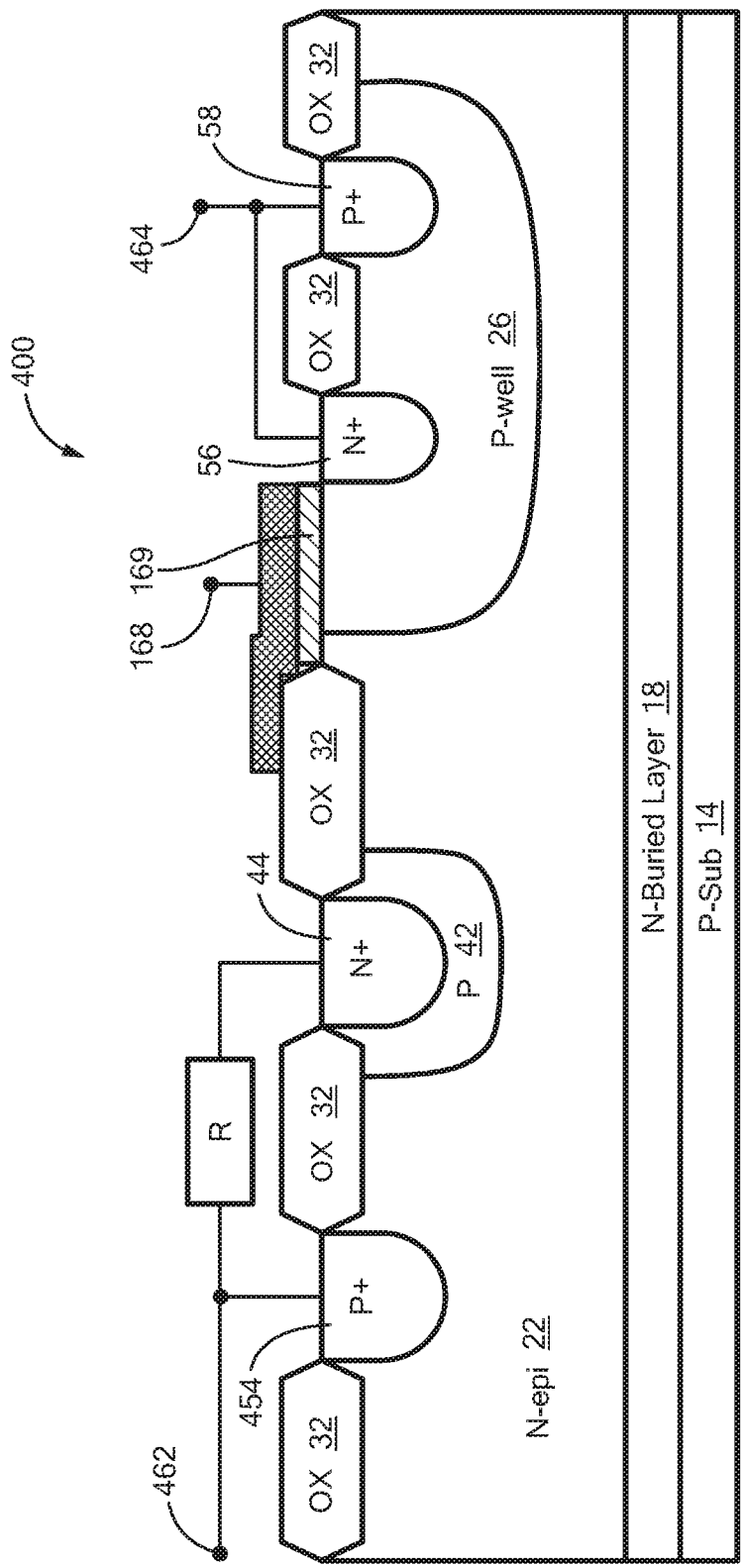
FIG. 4 is a block diagram of an example of a Zener diode embedded in a lateral insulated-gate bipolar transistor (IGBT)

Referring to FIG. 4, for example, the Zener diode 42, 44 is embedded into an IGBT to form an IGBT 400. The IGBT 400 is similar to the SCR 10 but does not include the N+-type region 54 but a P+-type region 454. Also, the IGBT 400 includes a collector 462 in place of a collector and an emitter 464 in place of the source and a gate 168 and gate dielectrics 169 between an oxide insulation region 32 and the N+-type region 56.

Figure 5:
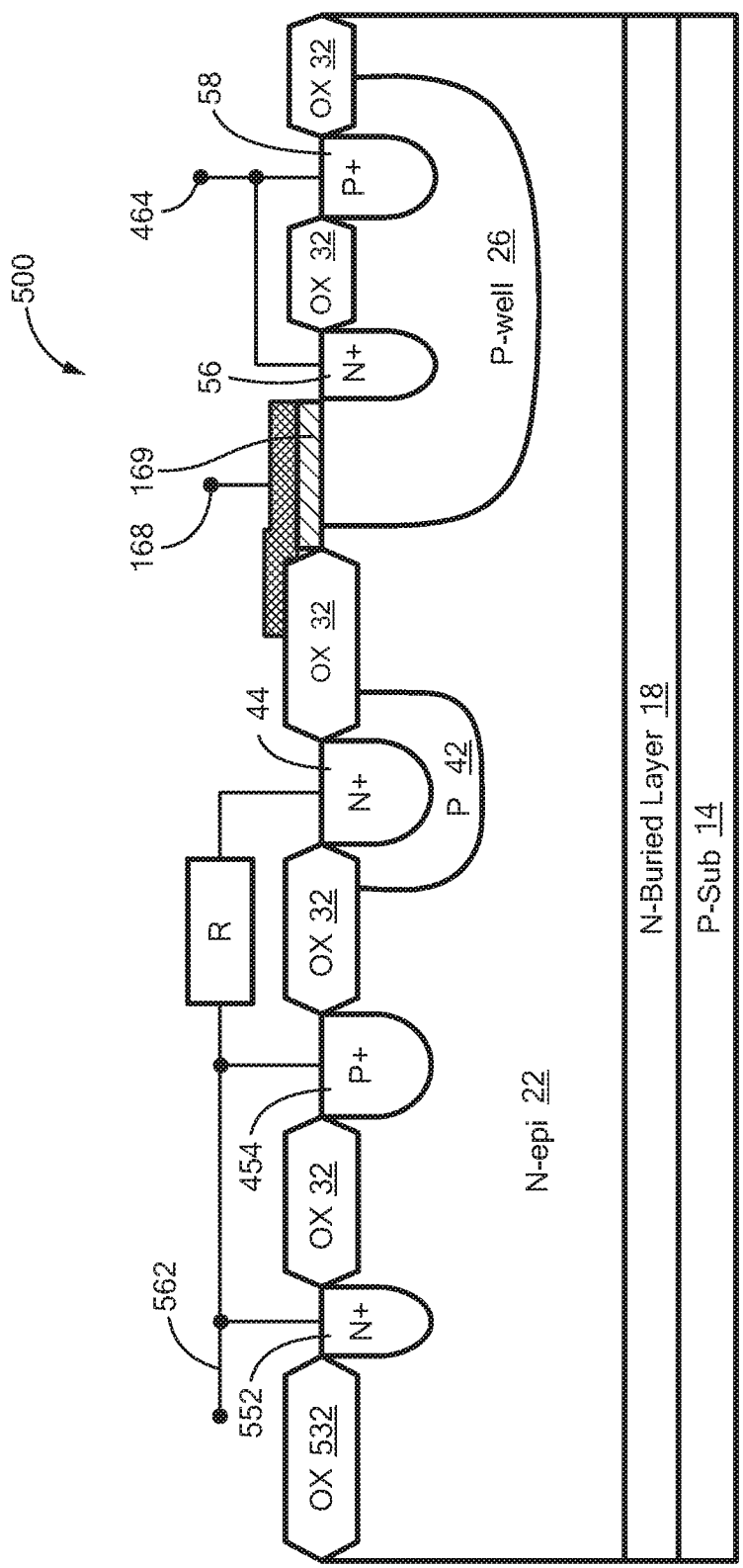
FIG. 5 is a block diagram of another example of the Zener diode embedded in a lateral IGBT.

Referring to FIG. 5, in another example, the Zener diode 42, 44 is embedded into an IGBT to form an IGBT 500. The IGBT 500 is similar to the IGBT 400, but includes an additional N+ region 552 and an additional oxide insulation region 532. Also, a collector 562 is connected to the N+-type region 552 along with the P+-type region 454 and the N+ region 44.

As p-type and n-type semiconductors are complementary in device physics, designs, and applications, the semiconductor regions in the embodiments described herein can be inverted to their complementary types and perform a similar purpose with their polarities of terminal voltages may be reversed, respectively. For example, n-type regions in the devices 100, 200, 300, 400 and 500 in FIGS. 1 to 5, respectively may be substituted with p-type regions and the p-type regions in the devices 100, 200, 300, 400 and 500 in FIGS. 1 to 5, respectively may be substituted with n-type regions. In one particular example, the Zener diode with a p-type region on top of the n-type region embedded in a SCR can provide similar ESD protection and ability to control the trigger voltage and the holding voltage. In one particular example, the Zener diode with a p-type region on top of the n-type region embedded in a p-channel LDMOS can provide similar ESD protection and ability to control the trigger voltage and the holding voltage. In one particular example, the Zener diode with a p-type region on top of the n-type region embedded in a p-channel IGBT can provide similar ESD protection and ability to control the trigger voltage and the holding voltage.

Figure 6:
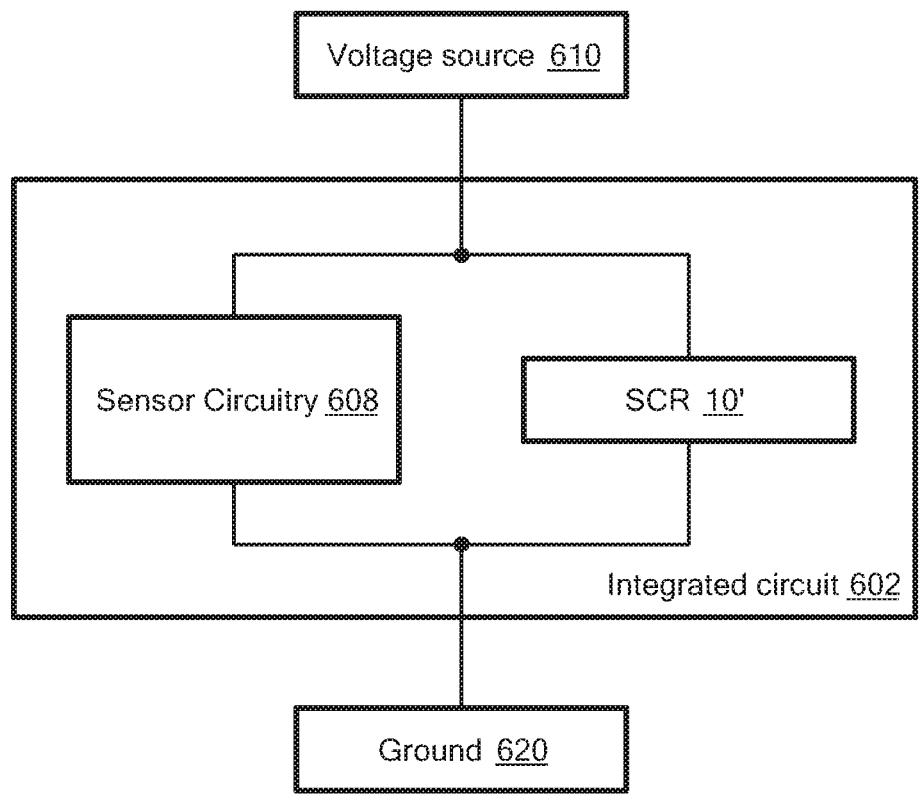
FIG. 6 is a block diagram of a device with an embedded Zener diode in an application.

Referring to FIG. 6, an integrated circuit 602 includes an SCR 10' similar to the SCR 10. The SCR 10' is in parallel with sensor circuitry 608 with respect to source voltage 610 and ground 620. In one example, the sensor circuitry includes a magnetic field sensor that includes one or more magnetic field sensing elements.

Certain applications (e.g., automotive applications) have specific requirements where ESD and EMC (Conducted Immunity) pulses are applied to a device under test (DUT) during operation. For example, a 12V car battery is connected between source voltage 610 and ground 620. If an ESD strike is coupled between the source voltage 610 and ground 620, an ESD clamp turns on and its holding voltage should not drop below 12V otherwise the clamp would fail hard due to a DC latch-up condition. Since the SCR 10' has no or little snapback, the SCR 10' may be used as an efficient ESD/ECM clamp for automotive requirements.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A silicon-controlled rectifier (SCR) comprising:
   a Zener diode;
   an n-type region;
   a first P+-type region extending into the n-type region;
   a first N+-type region extending into the n-type region;
   a p-type well extending into the n-type region;
   a second N+-type region extending into the p-type well; and
   a second P+-type region extending into the p-type well,
   wherein the Zener diode is embedded between the first and second N+-type regions and extending through a field oxide layer and into a single doped region, wherein the single doped region is the n-type region.

2. The SCR of claim 1, wherein the n-type region is an n-type epitaxial layer.

3. The SCR of claim 1, wherein the n-type region is an n-type well.

4. The SCR of claim 1, wherein the Zener diode comprises a third N+-type region and a P-type region.

5. The SCR of claim 4, wherein a first distance corresponding to a length between the P-well and the P-type region of the Zener diode contributes to determining a trigger voltage of the SCR.

6. The SCR of claim 5, wherein increasing a second distance corresponding to a length of the third N+-type region of the Zener diode to the N-type region contributes to determining the trigger voltage of the SCR.

7. The SCR of claim 6, wherein increasing a third distance corresponding to a length between the P-type region of the Zener diode and the first N+-type region contributes to determining a holding voltage of the SCR.

8. The SCR of claim 7, wherein increasing a fourth distance corresponding to a length between the P-type region of the Zener diode and the first P+-type region contributes to determining the holding voltage of the SCR.

9. The SCR of claim 8, wherein increasing a fifth distance corresponding to a length between a junction of the second N+-type and the p-type well and a junction of the p-type well and the N-type region contributes to determining the holding voltage of the SCR.

10. The SCR of claim 4, wherein the first P+-type region, the first N+-type region and the third N+-type region are electrically coupled to an anode terminal.

11. The SCR of claim 10, wherein a resistor is connected between the first N+ region and the third N+ region.

12. The SCR of claim 4, wherein the second P+ region and the second N+ region are electrically coupled to a cathode terminal.

13. The SCR of claim 1, wherein the SCR has no snapback.

14. The SCR of claim 1, wherein a snapback of the SCR is no greater than 10% of the trigger voltage.

15. The SCR of claim 1, wherein the first N+-type region is between the first P+ region and the Zener diode.

16. A silicon-controlled rectifier (SCR) comprising:
    a Zener diode;
    an p-type region;
    a first N+-type region extending into the p-type region;
    a first P+-type region extending into the p-type region;
    a n-type well extending into the p-type region;
    a second P+-type region extending into the n-type well; and
    a second N+-type region extending into the n-type well,
    wherein the Zener diode is embedded between the first and second P+-type regions and extending through a field oxide region and into a single doped region, wherein the doped region is the p-type region.

17. The SCR of claim 16, wherein the p-type region is an p-type epitaxial layer.

18. The SCR of claim 16, wherein the p-type region is an p-type well.

19. The SCR of claim 16, wherein the Zener diode comprises a third P+-type region and a N-type region.

20. The SCR of claim 19, wherein a first distance corresponding to a length between the n-well and the N-type region of the Zener diode contributes to determining a trigger voltage of the SCR.

21. The SCR of claim 20, wherein a second distance corresponding to a length of the third P+-type region of the Zener diode to the P-type region contributes to determining the trigger voltage of the SCR.

22. The SCR of claim 21, wherein a third distance corresponding to a length between the N-type region of the Zener diode and the first P+-type region contributes to determining a holding voltage of the SCR.

23. The SCR of claim 22, wherein a fourth distance corresponding to a length between the N-type region of the Zener diode and the first N+-type region contributes to determining the holding voltage of the SCR.

24. The SCR of claim 23, wherein a fifth distance corresponding to a length between a junction of the second P+-type and the n-type well and a junction of the n-type well and the P-type region contributes to determining the holding voltage of the SCR.

25. The SCR of claim 20, wherein the first N+-type region, the first P+-type region and the third N+-type region are directly connected to an anode terminal.

26. The SCR of claim 25, wherein a resistor is connected between the first P+ region and the third N+ region.

27. The SCR of claim 4, wherein the second N+ region and the second P+ region are directly connected to a cathode terminal.

28. The SCR of claim 16, wherein the SCR has no snapback.

29. The SCR of claim 16, wherein a snapback of the SCR is no greater than 10% of the trigger voltage.

30. The SCR of claim 16, wherein the first P+-type region is between the first N+ region and the Zener diode.

* * * * *